(12) United States Patent
Arai

(10) Patent No.: US 7,629,835 B2
(45) Date of Patent: Dec. 8, 2009

(54) BIAS CIRCUIT

(75) Inventor: Tomoyuki Arai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/178,034

(22) Filed: Jul. 23, 2008

(65) Prior Publication Data

US 2009/0153233 A1 Jun. 18, 2009

(30) Foreign Application Priority Data

Dec. 17, 2007 (JP) ............... 2007-324947

(51) Int. Cl.
   *G05F 1/10* (2006.01)
   *G05F 3/02* (2006.01)
(52) U.S. Cl. .................... 327/543; 327/563
(58) Field of Classification Search .......... 327/538, 327/540, 541, 543, 560–563; 323/315; 330/252–253
   See application file for complete search history.

(56) References Cited

U.S. PATENT DOCUMENTS 5,818,294 A * 10/1998 Ashmore, Jr. ............... 327/543

| 7,323,932 B2 * | 1/2008 | Matsushita | 330/253 |
| 7,417,415 B2 * | 8/2008 | Yen et al. | 323/316 |
| 7,456,692 B2 * | 11/2008 | Maruyama et al. | 330/295 |

OTHER PUBLICATIONS

Behzad Razavi. "Design of Analog CMOS Integrated Circuits" McGraw-Hill Publishing Co., 2001, pp. 375-379.
David A. Johns, et al. "Analog Integrated Circuit Design" John Wiley & Sons, Inc. 1986, pp. 450-451.

* cited by examiner

*Primary Examiner*—Quan Tra
(74) *Attorney, Agent, or Firm*—Katten Muchin Rosenman LLP

(57) ABSTRACT

A gm compensation current source controls current that runs through a current source transistor, source-grounded transistors that determine a gain so that mutual conductance gm of the source-grounded transistors is compensated and the gain is compensated. A 1/r current source runs current inversely proportional to variation of load resistors of an amplifier so that gate bias points of gate-grounded transistors that are connected to the source-grounded transistors remain constant, and deterioration of linearity at a drain terminal of a gate-grounded transistor is suppressed.

7 Claims, 2 Drawing Sheets

US 7,629,835 B2

BIAS CIRCUIT

CROSS-REFERENCE TO RELATED APPLICATIONS

This application is based upon and claims the benefit of priority from the prior Japanese Patent Application No. 2007-324947, filed on Dec. 17, 2007, the entire contents of which are incorporated herein by reference.

BACKGROUND OF THE INVENTION

1. Field of the Invention

The present invention relates to a bias circuit providing an analog circuit with a bias.

2. Description of the Related Art

The gain of an amplifier circuit depends on mutual conductance (gm) of a transistor that is a part of the amplifier circuit, and on the load connected to the transistor. The mutual conductance (gm) changes depending on the manufacturing process of the transistor or the temperature of the transistor. Therefore, compensation of the mutual conductance (gm) is significant for compensation of the gain of the amplifier circuit. A circuit that compensates mutual conductance (gm) (hereinafter "gm compensating circuit") is commonly known. According to "Design of Analog CMOS Integrated Circuits" (Behzad Razavi, McGraw-Hill Publication Co., Oct. 1, 2003, pp. 375-379), the amount of current running through a gm compensating circuit is, in light of the current mirror structure, the same as that running through a bias circuit that provides a source-grounded transistor of an amplifier circuit with a gate bias (gate-source voltage). As a result, the gate bias of the transistor is controlled and the mutual conductance gm is compensated so that the gain is compensated.

However, according to the conventional bias circuit, as the gm compensating circuit reduces the current running through the bias circuit when the gain increases, the bias point of a gate-grounded transistor connected to the drain terminal of the source-grounded transistor goes up in the amplifier circuit. Consequently, the output signal is distorted and the linearity is deteriorated when a signal of large amplitude is output from the drain terminal of the gate-grounded transistor (an output terminal of the amplifier circuit). Thus, the conventional bias circuit cannot obtain linearity and high gain of the amplifier circuit at the same time.

SUMMARY OF THE INVENTION

It is an object of the present invention to at least solve the above problems in the conventional technologies.

A bias circuit according to one aspect of the present invention includes: a current source transistor; a source-grounded transistor connected to the current source transistor; a gate-grounded transistor connected to the source-grounded transistor; a load resistor connected to the gate-grounded transistor; a first current source that runs electric current to the current source transistor and the source-grounded transistor, the electric current compensating mutual conductance of the source-grounded transistor; and a second current source that runs electric current based on the load resistor to control a gate bias of the gate-grounded transistor.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Referring to the accompanying drawings, exemplary embodiments according to the present invention are explained in detail below.

Figure 1:
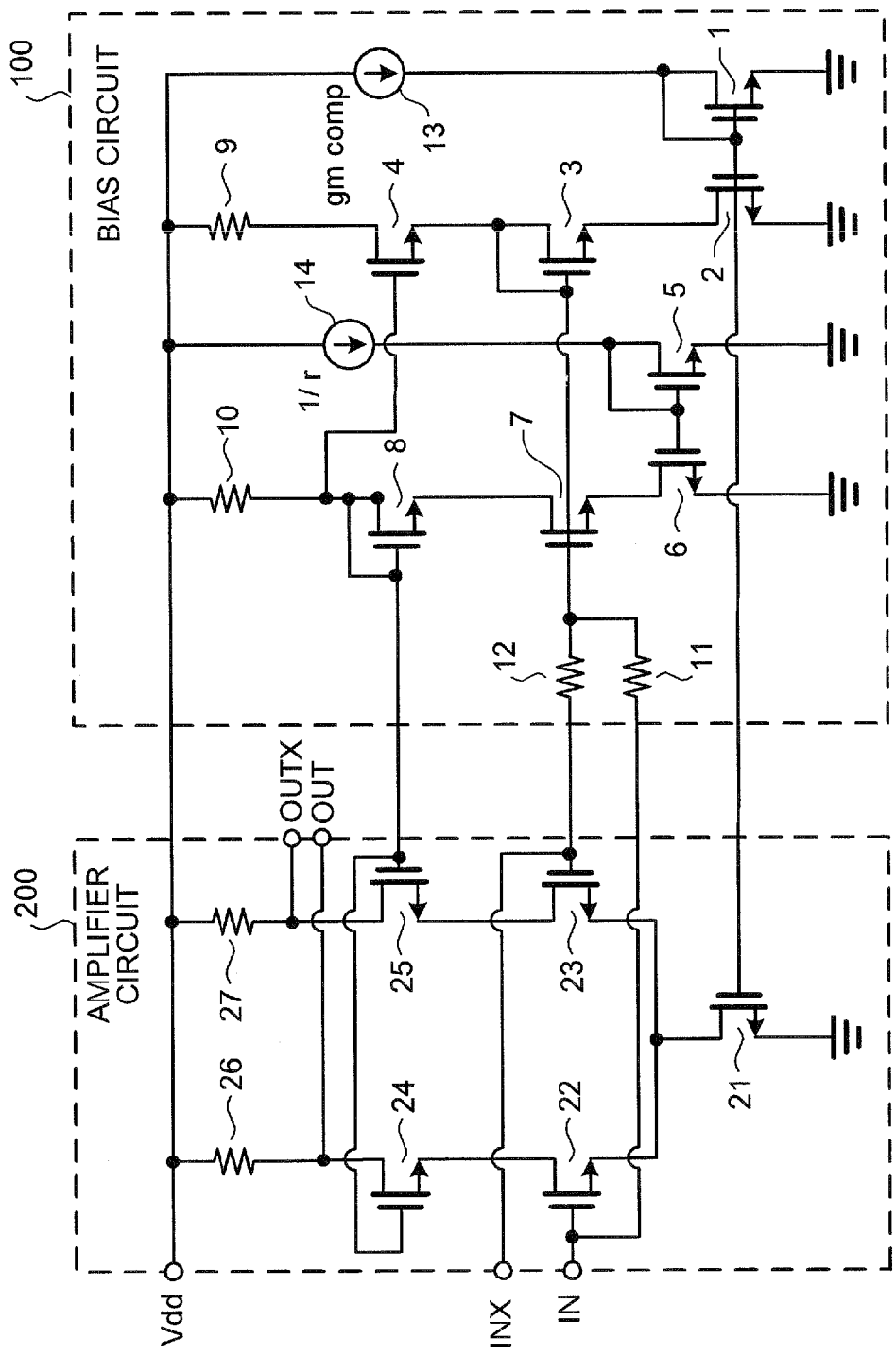
FIG. 1 is a circuit diagram of a bias circuit.

FIG. 1 is a circuit diagram of a bias circuit. A bias circuit 100 includes, for example, eight transistors 1-8, four resistors 9-12, a gm compensation current source 13 (a first current source), and a 1/r current source 14 (a second current source).

First through fourth transistors 1-4, a first resistor 9 and the gm compensation current source 13 are parts of a circuit that compensates mutual conductance (gm) of source-grounded transistors (transistors 22 and 23) that determines gain of an amplifier circuit 200. The gm compensation current source 13 is connected to both a power terminal $V_{dd}$ and a drain terminal of the first transistor 1. A source terminal of the first transistor 1 is grounded. A gate terminal of the first transistor 1 is connected to the drain terminal of the first transistor 1 and a gate terminal of a second transistor 2. Current from the gm compensation current source 13 to the first transistor 1 is controlled by a gm compensating circuit described hereinafter.

A source terminal of the second transistor 2 is grounded. A drain terminal of the second transistor 2 is connected to a source terminal of the third transistor 3. A gate terminal of the third transistor 3 is connected to a drain terminal of the third transistor 3 and a gate terminal of a seventh transistor 7. The drain terminal of the third transistor 3 is connected to a source terminal of the fourth transistor 4. The third transistor 3 serves as a second bias-providing transistor and provides the source-grounded transistors of the amplifier circuit 200 with a gate bias. A gate terminal of the fourth transistor 4 is connected to a drain terminal of an eighth transistor 8. A drain terminal of the fourth transistor 4 is connected to one end of the first resistor 9. The other end of the first resistor 9 is connected to the power terminal $V_{dd}$.

Fifth through eighth transistors 5-8, a second resistor 10 and the 1/r current source 14 are parts of a circuit that maintains a constant gate bias point of gate-grounded transistors (transistors 24 and 25) connected to the source-grounded transistors of the amplifier circuit 200. The 1/r current source 14 is connected to both the power terminal $V_{dd}$ and a drain terminal of the fifth transistor 5. Detailed structure of the 1/r current source 14 is described later. A source terminal of the fifth transistor 5 is grounded. A gate terminal of the fifth transistor 5 is connected to both a drain terminal of the fifth transistor 5 and a gate terminal of the sixth transistor 6.

A source terminal of the sixth transistor 6 is grounded. A drain terminal of the sixth transistor 6 is connected to a source terminal of the seventh transistor 7. The gate terminal of the seventh transistor 7 is connected to a non-inverting input terminal IN of the amplifier circuit 200 through a third resistor 11 and to an inverting input terminal INX of the amplifier circuit 200 through a fourth resistor 12.

A drain terminal of the seventh transistor 7 is connected to a source terminal of the eighth transistor 8. A gate terminal of the eighth transistor 8 is connected to a drain terminal of the eighth transistor 8. The drain terminal of the eighth transistor 8 is connected to one end of the second resistor 10. The eighth transistor 8 serves as a first bias-providing transistor and provides the gate-grounded transistors of the amplifier circuit 200 with a gate bias. The other end of the second resistor 10 is connected to the power terminal $V_{dd}$. Each transistor of the bias circuit 100 is, for example, an n-channel transistor.

The amplifier circuit 200 is a differential amplifier and includes, for example, a current source transistor 21, a first source-grounded transistor 22, a second source-grounded transistor 23, a first gate-grounded transistor 24, a gate-grounded transistor 25, a first load resistor 26 and a second load resistor 27. A gate terminal of the current source transistor 21 is connected to the gate terminal of the first transistor 1 of the bias circuit 100. A source terminal of the current source transistor 21 is grounded. A drain terminal of the current source transistor 21 is connected to a source terminal of the first source-grounded transistor 22 and to a source terminal of the second source-grounded transistor 23.

A gate terminal of the first source-grounded transistor 22 is connected to the non-inverting input terminal IN. A drain terminal of the first source-grounded transistor 22 is connected to a source terminal of the first gate-grounded transistor 24. A gate terminal of the first gate-grounded transistor 24 is connected to the gate terminal of the eighth transistor 8 of the bias circuit 100. A drain terminal of the first gate-grounded transistor 24 is connected to one end of the first load resistor 26 and a non-inverting output terminal OUT of the amplifier circuit. The other end of the first load resistor 26 is connected to power terminal $V_{dd}$.

A gate terminal of the second source-grounded transistor 23 is connected to the inverting input terminal INX. A drain terminal of the second source-grounded transistor 23 is connected to a source terminal of the second gate-grounded transistor 25. A gate terminal of the second gate-grounded transistor 25 is connected to the gate terminal of the eighth transistor 8 of the bias circuit 100. A drain terminal of the second gate-grounded transistor 25 is connected to one end of the second load resistor 27 and an inverting output terminal OUTX of the amplifier circuit 200. The other end of the second load resistor 27 is connected to the power terminal $V_{dd}$. Each transistor of the amplifier circuit 200 is, for example, an n-channel transistor. The amplifier circuit 200 is not restricted to the above exemplary structure.

In the bias circuit 100 and the amplifier circuit 200, there are the following relations concerning transistor dimensions and resistance. Gate lengths of the first transistor 1, the second transistor 2, the fifth transistor 5, the sixth transistor 6 and the current source transistor 21 are substantially equal. Gate lengths of the third transistor 3, the seventh transistor 7, the first source-grounded transistor 22 and the second source-grounded transistor 23 are substantially equal. Gate lengths of the fourth transistor 4, the eighth transistor 8, the first gate-grounded transistor 24 and the second gate-grounded transistor 25 are substantially equal. A ratio of a half gate width Wg of the current source transistor 21, a gate width Wg of the first source-grounded transistor 22 (the second source-grounded transistor 23), and a gate width Wg of the first gate-grounded transistor 24 (the second gate-transistor 25) is substantially equal to a ratio of gate widths Wg of the sixth, seventh, and eighth transistors, and also substantially equal to a ratio of gate widths Wg of the second, third, and fourth transistors.

A ratio between resistance values of the first load resistor 26 (the second load resistor 27) and the first resistor 9 is substantially equal to a ratio between gate width Wg of the third transistor 3 and gate width Wg of the first source-grounded transistor 22 (the second source-grounded transistor 23). A ratio between resistance values of the first load resistor 26 (the second load resistor 27) and the second resistor 10 is substantially equal to a ratio between gate width Wg of the seventh transistor 7 and gate width Wg of the first source-grounded transistor 22 (the second source-grounded transistor 23).

The first resistor 9, the second resistor 10, the first load resistor 26 and the second load resistor 27 each includes, for example, one unit resistor element or plural unit resistor elements connected in series or in parallel. The unit resistor elements are closely positioned and have substantially identical structures, materials, dimensions, and resistance values.

Figure 2:
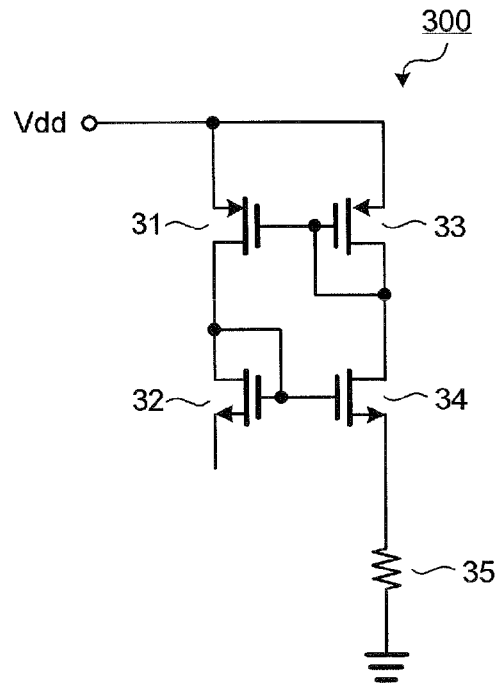
FIG. 2 is a circuit diagram of one example of a gm compensating circuit.

FIG. 2 is a circuit diagram of one example of a gm compensating circuit. As shown in FIG. 2, a gm compensating circuit 300 includes four transistors 31-34 and a fifth resistor 35. A source terminal of a ninth transistor 31 is connected to the power terminal $V_{dd}$. A drain terminal of the ninth transistor 31 is connected to a drain terminal of a tenth transistor 32. A gate terminal of the ninth transistor 31 is connected to a gate terminal of an eleventh transistor 33.

A gate terminal of the tenth transistor 32 is connected to a drain terminal of the tenth transistor 32 and a gate terminal of a twelfth transistor 34. A source terminal of the tenth transistor 32 is grounded. A source terminal of the eleventh transistor 33 is connected to the power terminal $V_{dd}$. A drain terminal of the eleventh transistor 33 is connected to its own gate terminal and a drain terminal of the twelfth transistor 34. A source terminal of the twelfth transistor 34 is connected to one end of the fifth resistor 35. The other end of the fifth resistor 35 is grounded. The ninth transistor 31 and the eleventh transistor 33 are, for example, p-channel transistors. The tenth transistor 32 and the twelfth transistor 34 are, for example, n-channel transistors.

The gm compensating circuit 300 is controlled so that mutual conductance (gm) of the twelfth transistor 34 remains constant. A gate length and gate width Wg of the twelfth transistor 34 is substantially equal to a gate length and gate width Wg of the first source-grounded transistor 22 or of the second source-grounded transistor 23 in the amplifier circuit 200. As a result, due to the current mirror configuration, current runs through the gm compensation current source 13 of the bias circuit 100 in proportion to current running through the twelfth transistor 34. The gm compensating circuit 300 is not restricted to the above exemplary structure.

Figure 3:
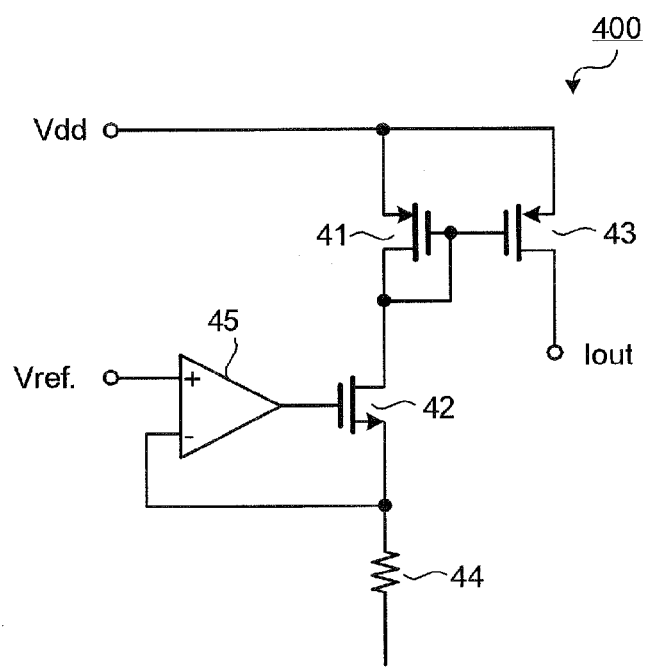
FIG. 3 is a circuit diagram of an example of a 1/r current source.

FIG. 3 is a circuit diagram of an example of a 1/r current source. As shown in FIG. 3, a 1/r current source 400 includes three transistors 41-43, a sixth resistor 44 and an operational amplifier 45. A source terminal of a thirteenth transistor 41 is connected to the power terminal $V_{dd}$. A drain terminal of the thirteenth transistor 41 is connected to a drain terminal of a fourteenth transistor 42. A gate terminal of the thirteenth transistor 41 is connected to a drain terminal of the thirteenth transistor 41 and a gate terminal of a fifteenth transistor 43.

A source terminal of the fourteenth transistor 42 is connected to one end of the sixth resistor 44 and an inverting input terminal of the operation amplifier 45. A gate terminal of the fourteenth transistor 42 is connected to an output terminal of the operational amplifier 45. The other end of the sixth resistor 44 is grounded. A reference voltage $V_{ref}$ is applied to a non-inverting input terminal of the operational amplifier 45. A source terminal of the fifteenth transistor 43 is connected to the power terminal $V_{dd}$. A drain terminal of the fifteenth transistor 43 functions as an output terminal $I_{out}$ for current. The thirteenth transistor 41 and the fifteenth transistor 43 are, for example, p-channel transistors. The fourteenth transistor 42 is, for example, an n-channel transistor.

When a resistance value of the sixth resistor 44 is higher than a design value, current running through the thirteenth transistor 41 decreases so that a source voltage of the fourteenth transistor 42 does not exceed the reference voltage $V_{ref}$. In this case, due to the current mirror configuration, current from the output terminal $I_{out}$ decreases. When a resistance value of the sixth resistor 44 is lower than a design value, current running through the thirteenth transistor 41 increases so that a source voltage of the fourteenth transistor 42 does not become lower than the reference voltage $V_{ref}$. In this case, due to the current mirror configuration, current from the output terminal $I_{out}$ increases. In this way, the 1/r current source 400 passes electric current inversely proportional to variations in the resistance values of the sixth resistor 44.

The sixth resistor 44 includes, for example, one unit resistor element or plural unit resistor elements connected in series or in parallel as the first load resistor 26 and the second load resistor 27. The unit resistor element of the sixth resistor 44 is substantially identical in structure, material, dimensions and resistance as other unit resistor elements, and is positioned near unit resistor elements of the first load resistor 26 and the second load resistor 26.

Consequently, variation in the resistance value of the first load resistor 26 and the second load resistor 27 is reflected on variation of the resistance value of the sixth resistor 44. The 1/r current source 400, i.e., the 1/r current source 14 of the bias circuit 100, runs electric current inversely proportional to variation of the resistance value of the first load resistor 26 and variation of the resistance value of the second load resistor 27. The 1/r current source 400 is not restricted to the above exemplary structure.

Functions of the bias circuit 100 are explained below. Due to the current mirror configuration, electric current running through the current source transistor 21 and the second transistor 2 is controlled by electric current running through the first transistor 1, namely electric current running through the gm compensation current source 13. As a result, current running through the first source-grounded transistor 22 and the second source-grounded transistor 23 is controlled by the gm compensation current source 13.

Further, current running through the third transistor 3 is controlled by the gm compensation current source 13. Gate bias of the seventh transistor 7, of the first source-grounded transistor 22, and of the second source-grounded transistor 23 are controlled by the third transistor 3, namely the gm compensation current source 13. Accordingly, mutual conductance (gm) of the first source-grounded transistor 22 and mutual conductance (gm) of the second source-grounded transistor 23 are compensated. Since gain of the amplifier circuit 200 is determined based on the first source-grounded transistor 22 and the second source-grounded transistor 23, the gain of the amplifier circuit 200 is compensated.

Connection of the third transistor 3, the fourth transistor 4 and the first resistor 9; connection of the first source-grounded transistor 22, the first gate-grounded transistor 24 and the first load resistor 26; and connection of the second source-grounded transistor 23, the second gate-grounded transistor 25 and the second load resistor 27 are similar. Consequently, a drain voltage of the third transistor 3 becomes substantially equal to drain voltages of the first source-grounded transistor 22 and the second source-grounded transistor 23, thereby improving precision.

Due to the current mirror configuration, current running through the sixth transistor 6 is controlled by current running through the fifth transistor 5, namely by current from the 1/r current source 14. As a result, current running through the eighth transistor 8 is controlled by current from the 1/r current source 14 so that a drain voltage of the eighth transistor 8 is kept constant, not affected by variation originating from a manufacturing process.

Since gate bias of the first gate-grounded transistor 24 and the second gate-grounded transistor 25 are substantially equal to a drain voltage of the eighth transistor 8, gate bias points of the first gate-grounded transistor 24 and the second gate-grounded transistor 25 are fixed and are not affected by variation of the current running through the gm compensation current source 13 or variation caused by a manufacturing process. In this way, deterioration of linearity of the non-inverting output terminal OUT and the inverting output terminal OUTX of the amplifier circuit 200 is suppressed.

Connection of the sixth transistor 6, the seventh transistor 7 and the eighth transistor 8 is substantially identical to the connection of the current source transistor 21, the first source-grounded transistor 22 and the first gate-grounded transistor 24 and the connection of the current source transistor 21, the second source-grounded transistor 23 and the second gate-grounded transistor 25. A source voltage of the eighth transistor 8 becomes substantially equal to a source voltage of the first gate-grounded transistor 24 and a source voltage of the second gate-grounded transistor 25, thereby improving precision.

According to exemplary embodiments, both compensation of linearity and compensation of gain of the amplifier circuit 20 are achieved against variation caused by a manufacturing process.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A bias circuit comprising:
   a current source transistor;
   a source-grounded transistor connected to the current source transistor;
   a gate-grounded transistor connected to the source-grounded transistor;
   a load resistor connected to the gate-grounded transistor;
   a first current source that runs electric current to the current source transistor and the source-grounded transistor, the electric current compensating mutual conductance of the source-grounded transistor; and
   a second current source that runs electric current based on the load resistor to control a gate bias of the gate-grounded transistor.

2. The bias circuit according to claim 1, wherein a configuration of a circuit connected to a source terminal of a transistor that provides a gate terminal of the gate-grounded transistor with a bias is substantially identical to a configuration of a circuit connected to a source terminal of the gate-grounded transistor.

3. The bias circuit according to claim 2, wherein a ratio between dimensions of a first bias-providing transistor that provides the gate terminal of the gate-grounded transistor with a bias and dimensions of a transistor connected to a source terminal of the first bias-providing transistor is substantially equal to a ratio between dimensions of the gate-grounded transistor and dimensions of the source-grounded transistor connected to the source terminal of the gate-grounded transistor.

4. The bias circuit according to claim 3, wherein electric current corresponding to the electric current from the second current source runs to the first bias-providing transistor.

5. The bias circuit according to claim 1, wherein a configuration of a circuit connected to a drain terminal of a transistor that provides a gate terminal of the source-grounded transistor with a bias is substantially identical to a configuration of a circuit connected to a drain terminal of the source-grounded transistor.

6. The bias circuit according to claim 5, wherein a ratio between dimensions of a second bias-providing transistor that provides the gate terminal of the source-grounded transistor with a bias and dimensions of a transistor connected to a drain terminal of the second bias-providing transistor is substantially equal to a ratio between dimensions of the source-grounded transistor and dimensions of the gate-grounded transistor connected to the drain terminal of the source-grounded transistor.

7. The bias circuit according to claim 6, wherein electric current corresponding to the electric current from the first current source runs to the second bias-providing transistor.

* * * * *